United States Patent [19]

Hollaus et al.

[11] Patent Number: 4,567,316
[45] Date of Patent: Jan. 28, 1986

[54] SOLAR CELL MODULE

[75] Inventors: Reinhard Hollaus, Taufkirchen; Rudolf Zehetbauer; Klaus Bednorz, both of Munich, all of Fed. Rep. of Germany

[73] Assignee: Siemens Aktiengesellschaft, Berlin and Munich, Fed. Rep. of Germany

[21] Appl. No.: 583,875

[22] Filed: Feb. 27, 1984

[30] Foreign Application Priority Data

Mar. 1, 1983 [DE] Fed. Rep. of Germany ....... 3307202

[51] Int. Cl.$^4$ ............................................. H01L 31/04
[52] U.S. Cl. .................................... 136/246; 136/244
[58] Field of Search ................................ 136/244, 246

[56] References Cited

U.S. PATENT DOCUMENTS 4,257,821 3/1981 Kelly et al. ...................... 136/244
4,481,378 11/1984 Lesk ................................... 136/244

OTHER PUBLICATIONS

M. Giuliano et al., *Conf. Record*, 15th *IEEE Photovoltaic Specialists Conf.*, (1981), pp. 997–1000.

*Primary Examiner*—Aaron Weisstuch
*Attorney, Agent, or Firm*—Herbert L. Lerner; Laurence A. Greenberg

[57] ABSTRACT

A solar cell module assembly includes a solar cell module including individual solar cells disposed in rows and at least partly electrically interconnected in series, and at least one bypass diode shunted across at least some of the series-connected solar cells, the at least one diode being normally cut off during operation of the solar cell module and the at least one diode being directly integrated into the solar cell module.

1 Claim, 8 Drawing Figures

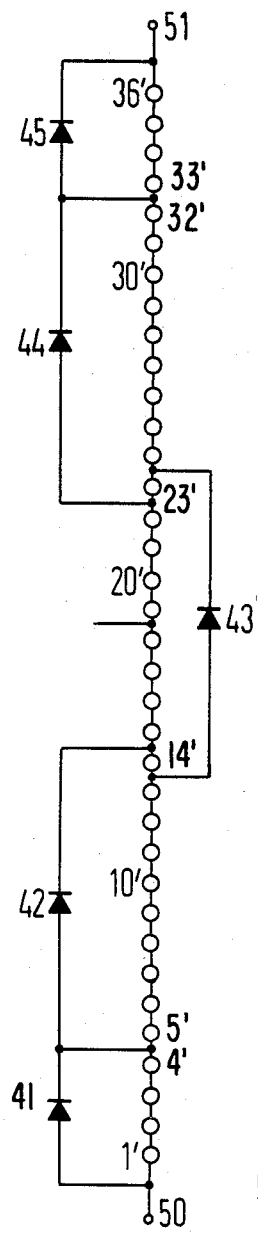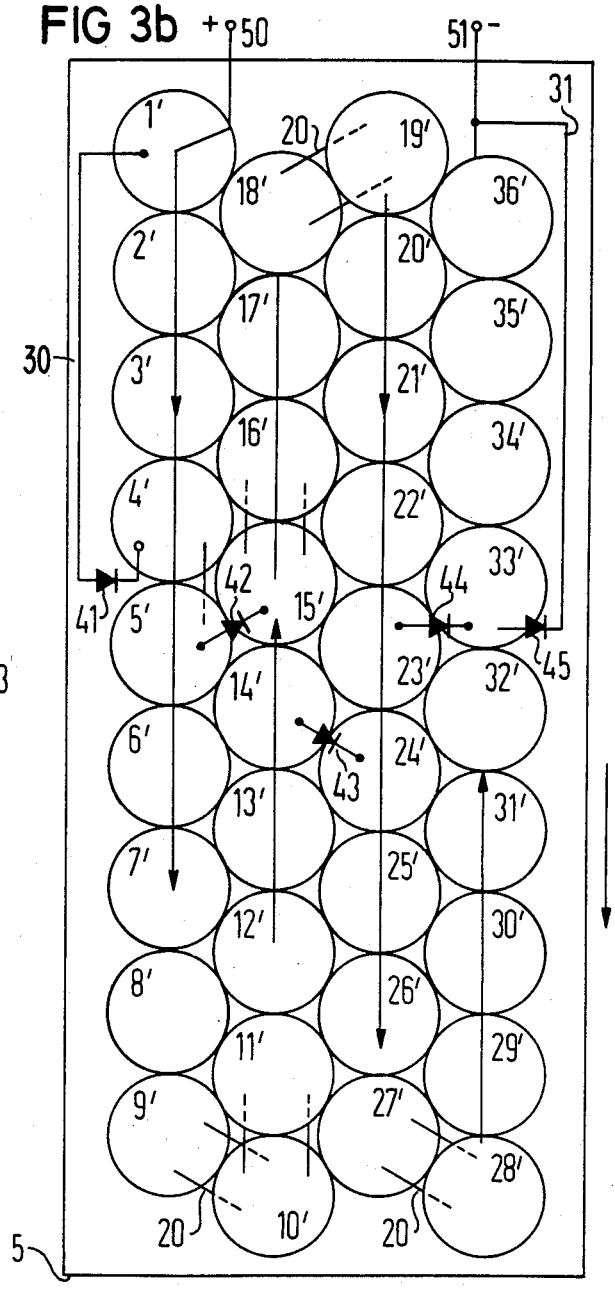

SOLAR CELL MODULE

The invention relates to a solar cell module formed of individual solar cells which are disposed in rows and are at least partly electrically connected in series, and at least one bypass diode shunted as a normally cut-off diode across the series-connected solar cells, i.e., the bypass diode is biased in the cut-off direction during the normal operation of the solar cell module.

If solar cells are connected in series, which is usually the case in a solar cell module, the voltage in individual solar cells and, as the case may be, the voltage in an entire "string" of solar cells, can be reversed if there is a current overload. Such a current overload can occur in the event of heavy fluctuations of the radiation incident on individual solar module areas. This voltage reversal is prevented by so-called bypass or shunt diodes, which limit the possibility of overheating of less strongly irradiated solar cells.

However, this type of solar cell module requires additional conductors connected between the solar cell strings and the bypass diodes. Furthermore, the module must be insulated and assembly in a junction box is expensive.

It is accordingly an object of the invention to provide a solar cell module which overcomes the hereinafore-mentioned disadvantages of the heretofore-known devices of this general type, and in which the bypass diodes are attached without great effort and without additional conductors.

With the foregoing and other objects in view there is provided, in accordance with the invention, a solar cell module assembly, comprising a solar cell module including individual solar cells disposed in rows and at least partly electrically interconnected in series, and at least one bypass diode shunted across at least some of said series-connected solar cells, said at least one diode being normally cut off during operation of said solar cell module and said at least one diode being directly integrated into said solar cell module.

In the solar cell module according to the invention, separate conductors which lead from the individual strings of solar cells to the bypass diodes are therefore not needed. Furthermore, the junction box, in which the bypass diodes were heretofore housed, can be made smaller or eliminated altogther. The expensive assembly of the bypass diodes in such a junction box is accordingly not necessary. In addition, the insulation can be simplified since no separate conductors lead to the bypass diodes.

In accordance with another feature of the invention, the at least one bypass diode is directly connected from one of the solar cells to another or between two cells of different strings.

In accordance with a further feature of the invention, there is provided a short conductor ribbon, the solar cells having rear surfaces or backs facing away from a source of solar radiation, and the at least one bypass diode includes a first electrode lying directly against the rear surface of one of the solar cells and another electrode connected through the short conductor ribbon to the rear surface of another of the solar cells.

In accordance with an added feature of the invention, there is provided a conductor ribbon interconnecting two of the solar cells of a string, the at least one bypass diode being connected between another of the solar cells of a different string and the conductor ribbon.

In accordance with a concomitant feature of the invention, there is provided a sheet metal cooling body connected to the conductor ribbon, the at least one bypass diode being diposed on the cooling body.

According to the invention, the bypass diodes are therefore incorporated directly into the plastic assembly of the solar cell module together with the individual solar cells, which leads to substantially simplified wiring and avoids expensive junction boxes for the bypass diodes. In practice, the bypass diodes are accomodated either in the space between three solar cells or on the back of a solar cell, which then at the same time forms a good cooling surface.

Other features which are considered as characteristic for the invention are set forth in the appended claims.

Although the invention is illustrated and described herein as embodied in a solar cell module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3a is a basic schematic circuit diagram of an embodiment of the solar cell module according to the invention, with several bypass diodes;

FIG. 3b is a diagrammatic top plan view of the solar cell module according to the invention, corresponding to the basic circuit diagram which is shown in FIG. 3a;

Figure 1:
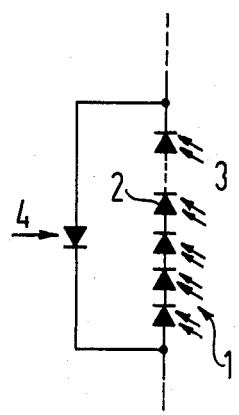
FIG. 1 is a basic schematic circuit diagram for a bypass diode in a solar cell module.

Referring now to the figures of the drawing in detail, and first particularly to FIG. 1 thereof, there is seen a basic schematic circuit diagram of a bypass or shunt diode, connected to a solar cell module formed of a string 1 of several series-connected solar cells 2. The radiation incident on the solar cells 2 is indicated diagrammatically by arrows 3. A bypass diode 4 is connected parallel to the string 1 in the non-conducting direction. In the event of a voltage reversal due to a current overload in the solar cells 2, the bypass diode 4 will therefore be connected in the conducting direction relative to the "reversed" current flow, so that the string 1 is nearly short-circuited, and the possible over heating of an individual solar cell is limited by the active solar cells remaining in the short-circuited circuit.

Figure 2:
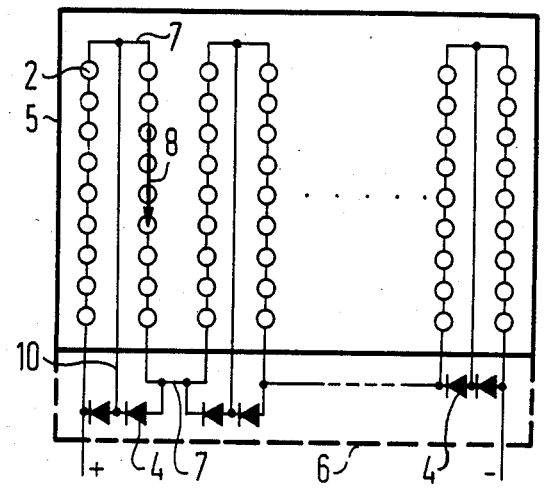
FIG. 2 is a diagrammatic and schematic view of a conventional solar cell module.

In the prior art, bypass diodes 4 had been accomodated outside the solar cell assembly proper, in a so-called junction box of the solar cell module. FIG. 2 diagrammatically illustrates such a solar cell module 5 with a junction box 6, in which the individual bypass diodes 4 are diposed. All of the solar cells 2 are connected in series in the solar module 5, as is indicated by a conductor 7 and arrows 8. A separate additional conductor 10 leads out of the solar cell assembly after each string of solar cells 2, and ends at the bypass diodes 4 which are housed in the junction box 6. Thus, one bypass diode 4 shunts each respective chain of solar cells 2. As can be seen from FIG. 2, such a solar cell module requires the additional conductors 10, and in addition, the module must be insulated. The assembly of the individual bypass diodes 4 in the junction box 6 is also costly.

FIG. 3a is a basic circuit diagram of the solar cell module according to the invention, which is shown diagrammatically in FIG. 3b. In the circuit of FIG. 3a, the solar cells 1' to 36' are connected in series. The input of the solar cell 1' is connected by a bypass diode 41 to the output of the solar cell 4'. Similarly, a bypass diode 42 is connected between the input of the solar cell 5' and the output of the solar cell 14'. A further bypass diode 43 is provided between the input of the solar cell 14' and the output of the solar cell 23'. In addition, a bypass diode 44 is connected between the input of the solar cell 23' and the output of the solar cell 32'. Finally, a further bypass diode 45 is provided between the input of the solar cell 33' and the output of the solar cell 36'. The bypass diodes 41 to 45 are respectively connected parallel to the strings of solar cells 1' to 4', 5' to 14', 14' to 23', 23' to 32' and 33' to 36', associated therewith, like the diode 4 in the circuit of FIG. 1.

FIG. 3b shows the way in which the individual bypass diodes 41 to 45 are disposed in the solar cell module 5. The solar cells 1' to 36' are connected in series corresponding to FIG. 2, as is indicated by the arrows 8. Adjacent solar cells in this series are connected to each other through conductor ribbons 20. Only the conductor ribbons connecting the solar cells 9' and 10', 18' and 19' as well as 27' and 28', are shown schematically in the drawing, for simplifying the presentation. These conductor ribbons 20 lead from the upper surface of a preceding solar cell to the lower surface of the next following solar cell, so that the desired series circuit is produced. In this manner, all of the solar cells 1' to 36' are connected between a positive terminal 50 and a negative terminal 51.

Contrary to the conventional solar cell module shown in FIG. 2, an expensive junction box is not required for the bypass diodes 41 to 45. The cost of the wiring can also be reduced substantially, since only short conductors 30, 31 are required between the bypass diode 41 and the solar cell 1' and between the bypass diode 45 and the negative terminal 51, respectively.

Figure 4A:
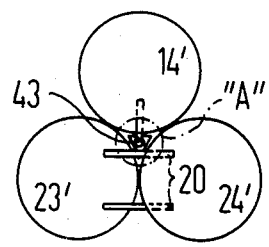
FIG. 4a is a top plan view of a first embodiment for accomodating the bypass diode in the solar cell module according the the invention.
Figure 4B:
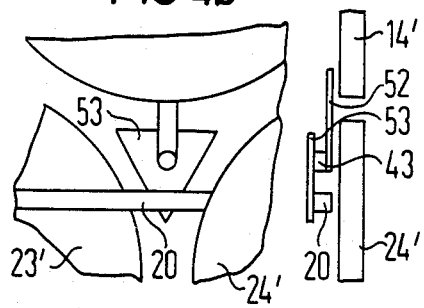
FIG. 4b is a fragmentary, enlarged top plan and side view of a portion of FIG. 4a contained in the dot-dash circle "A" thereof.

FIG. 4a shows how a bypass diode, such as the bypass diode 43, can be disposed between the solar cell 14' and the conductor ribbon 20 interconnecting the solar cells 23' and 24'. In FIG. 4b, the detail "A" of FIG. 4a is shown. The left half of FIG. 4b shows a top view and the right half of FIG. 4b shows a side view.

The bypass diode 43 proper, i.e., the diode chip, rest on one hand on a metallic cooling strip 53 which is connected to the conductor ribbon 20 connected between the solar cells 23' and 24' and on the other hand, the diode chip is connected through a connecting ribbon 52, to the lower surface of the solar cell 14'. The cooling strip 53 provides sufficient heat removal from the bypass diode 43.

Figure 5A:
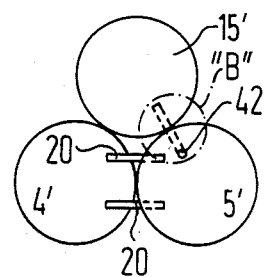
FIG. 5a is a view similar to FIG. 4a of a second embodiment for accomodating the bypass diode in the solar cell module according to the invention.
Figure 5B:
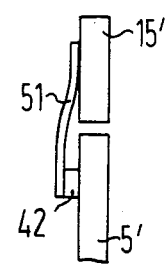
FIG. 5b is a fragmentary enlarged view of a portion of FIG. 5a contained in the dot-dash circle "B" thereof, as seen from the side.

FIG. 5a shows how a diode, such as the bypass diode 42, can be connected between the solar cells 5' and 15'. FIG. 5b shows the detail "B" of this bypass diode 42.

In this embodiment, the bypass diode 42 is connected on one hand, directly on the lower surface of the solar cell 5' and is connected, on the other hand, to the lower surface of the solar cell 15' through a connecting ribbon 51. In this embodiment, the solar cell 5' directly removes heat produced in the bypass diode 42.

The foregoing is a description corresponding in substance to German application No. P 33 07 202.7, filed Mar. 1, 1983, the International priority of which is being claimed for the instant application and which is hereby made part of this application. Any discrepancies between the foregoing specification and the aforementioned corresponding German application are to be resolved in favor of the latter.

We claim:

1. Solar cell module assembly, comprising a plurality of individual solar cells disposed in rows and at least partly electrically interconnected in series, at least one bypass diode shunted across at least some of said series-connected solar cells, said at least one diode being noramlly cut off during operation of said solar cell module and directly integrated into said solar cell module, a conductor ribbon electrically interconnecting two of said solar cells in series, and a sheet metal cooling body connected to said conductor ribbon, said at least one bypass diode being disposed on said cooling body and being connected between another of said solar cells and said conductor ribbon.

* * * * *